US010205001B2

(12) United States Patent
Pendharkar et al.

(10) Patent No.: US 10,205,001 B2
(45) Date of Patent: Feb. 12, 2019

(54) HYBRID ACTIVE-FIELD GAP EXTENDED DRAIN MOS TRANSISTOR

(71) Applicant: Texas Instruments Incorporated, Dallas, TX (US)

(72) Inventors: Sameer P. Pendharkar, Allen, TX (US); John Lin, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/226,036

(22) Filed: Aug. 2, 2016

(65) Prior Publication Data
US 2016/0343852 A1 Nov. 24, 2016

Related U.S. Application Data

(60) Continuation of application No. 14/284,696, filed on May 22, 2014, now Pat. No. 9,608,088, which is a
(Continued)

(51) Int. Cl.
*H01L 29/40* (2006.01)
*H01L 29/66* (2006.01)
(Continued)

(52) U.S. Cl.
CPC .... *H01L 29/66681* (2013.01); *H01L 29/0653* (2013.01); *H01L 29/0696* (2013.01); *H01L 29/0882* (2013.01); *H01L 29/402* (2013.01); *H01L 29/41758* (2013.01); *H01L 29/4238* (2013.01); *H01L 29/7816* (2013.01)

(58) Field of Classification Search
CPC ............. H01L 29/7816; H01L 29/0653; H01L 29/0696; H01L 29/0882; H01L 29/402; H01L 29/41758; H01L 29/4238; H01L 29/66681
See application file for complete search history.

(56) References Cited

U.S. PATENT DOCUMENTS

| 5,304,827 A | 4/1994 | Malhi et al. |
| 5,777,366 A | 7/1998 | Contiero et al. |

(Continued)

FOREIGN PATENT DOCUMENTS

| CN | 101383376 A | 3/2009 |
| WO | WO2010046794 A1 | 4/2010 |

OTHER PUBLICATIONS

PRC Search Report for Application No. 2016103772050.

*Primary Examiner* — Asok K Sarkar
*Assistant Examiner* — Dmitriy Yemelyanov
(74) *Attorney, Agent, or Firm* — Andrew R. Ralston; Charles A. Brill; Frank D. Cimino

(57) ABSTRACT

An integrated circuit includes an extended drain MOS transistor with parallel alternating active gap drift regions and field gap drift regions. The extended drain MOS transistor includes a gate having field plates over the field gap drift regions. The extended drain MOS transistor may be formed in a symmetric nested configuration. A process for forming an integrated circuit containing an extended drain MOS transistor provides parallel alternating active gap drift regions and field gap drift regions with a gate having field plates over the field gap drift regions.

20 Claims, 6 Drawing Sheets

Related U.S. Application Data division of application No. 13/281,260, filed on Oct. 25, 2011, now Pat. No. 8,754,469.

(60) Provisional application No. 61/406,640, filed on Oct. 26, 2010.

(51) Int. Cl.
    *H01L 29/06*      (2006.01)
    *H01L 29/417*     (2006.01)
    *H01L 29/423*     (2006.01)
    *H01L 29/78*      (2006.01)
    *H01L 29/08*      (2006.01)

(56) References Cited

U.S. PATENT DOCUMENTS

| | | | |
|---|---|---|---|
| 6,160,290 A | 12/2000 | Pendharkar | |
| 6,878,603 B2* | 4/2005 | Bromberger | H01L 29/0653 |
| | | | 438/390 |
| 6,900,101 B2* | 5/2005 | Lin | H01L 29/66689 |
| | | | 257/E21.345 |
| 7,851,317 B2* | 12/2010 | Kim | H01L 29/0653 |
| | | | 438/306 |
| 2005/0110081 A1 | 5/2005 | Pendharkar | |
| 2009/0096022 A1 | 4/2009 | Chang et al. | |
| 2009/0140335 A1* | 6/2009 | Schneider | H01L 29/0847 |
| | | | 257/344 |
| 2009/0256199 A1 | 10/2009 | Denison et al. | |
| 2009/0256212 A1 | 10/2009 | Denison et al. | |
| 2010/0032754 A1 | 2/2010 | Kawaguchi | |
| 2011/0147844 A1 | 6/2011 | Smith | |

* cited by examiner

HYBRID ACTIVE-FIELD GAP EXTENDED DRAIN MOS TRANSISTOR

CROSS REFERENCE TO RELATED APPLICATIONS

Under 35 U.S.C. §§ 119(e), 120, 121, this continuation application claims priority to and benefits of U.S. patent application Ser. No. 14/284,696, filed on May 22, 2014, which is a divisional application of U.S. patent application Ser. No. 13/281,260, filed on Oct. 25, 2011, which claims priority to and benefit of U.S. Provisional Appl. No. 61/406,640, filed on Oct. 26, 2010. The entirety of the above referenced applications are hereby incorporated herein by reference.

FIELD

This disclosure relates to the field of integrated circuits. More particularly, this disclosure relates to extended drain MOS transistors in integrated circuits.

BACKGROUND

An integrated circuit may contain an extended drain metal oxide semiconductor (MOS) transistor with a drift region in the drain region adjacent to the channel region, such as a laterally diffused metal oxide semiconductor (LDMOS) transistor, a double-diffused metal oxide semiconductor (DMOS) transistor or a drain extended metal oxide semiconductor (DEMOS) transistor. Generally, an average doping in the drift region is less than half an average doping density in the source region of the MOS transistor. An extended drain MOS transistor with the drift region covered by a gate extension field plate, sometimes referred to as a field gap MOS transistor, may exhibit a breakdown voltage above 10 volts, but may have an undesirably large resistance in the drain due to a field oxide element in the drain to terminate the field plate. An extended drain MOS transistor with no field plate over the drift region, sometimes referred to as an active gap MOS transistor, may undesirably exhibit a breakdown voltage below 10 volts and degraded reliability due to hot carrier generation at an edge of the gate.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated circuit may include an extended drain MOS transistor with parallel alternating active gap drift regions and field gap drift regions. The extended drain MOS transistor includes a gate having field plates over the field gap drift regions. A symmetric nested configuration of the extended drain MOS transistor may be formed. A process of forming the integrated circuit is disclosed.

DETAILED DESCRIPTION

Figure 1A:
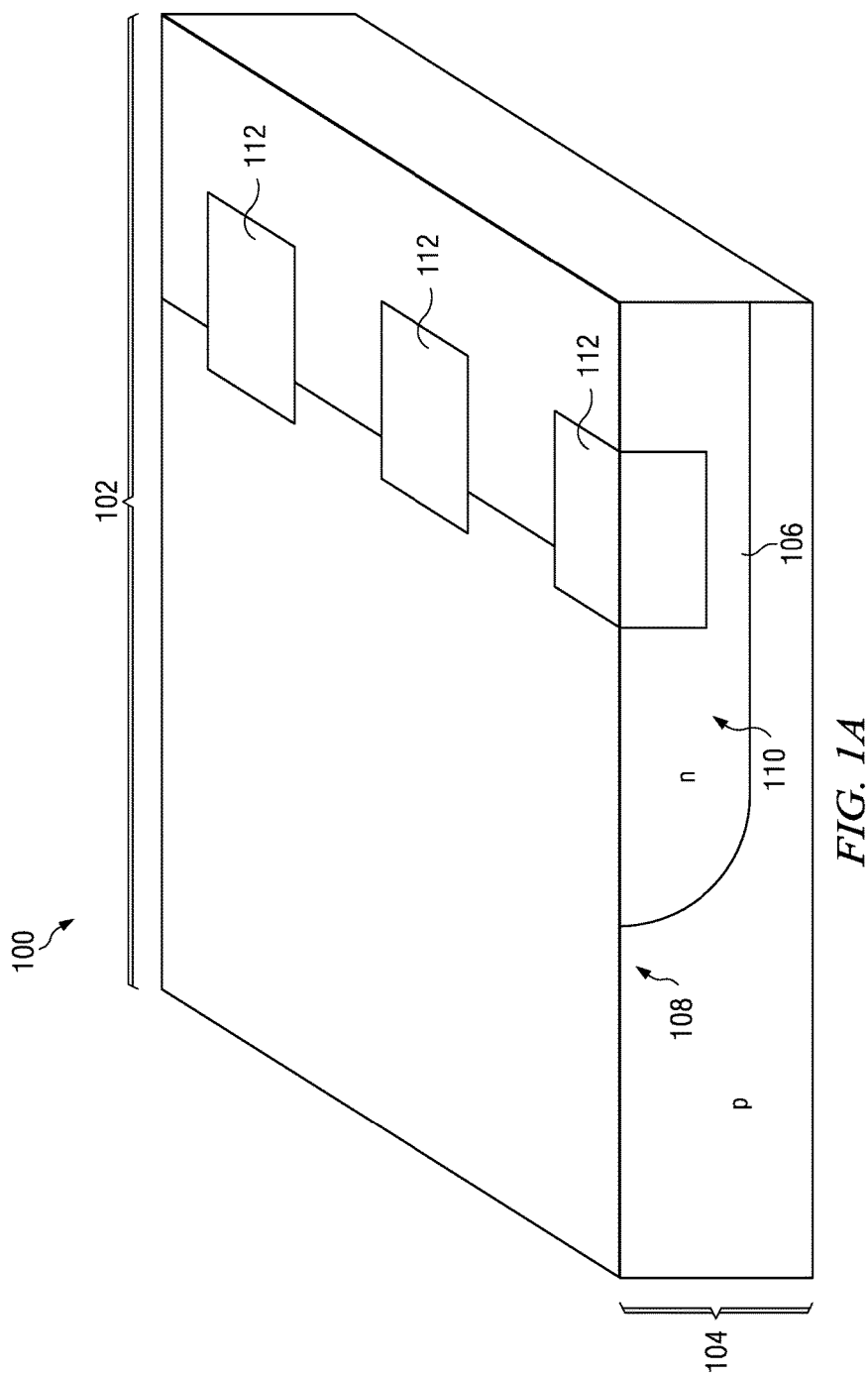
FIG. 1A and FIG. 1B are perspective views of an integrated circuit containing a hybrid active-field gap extended drain MOS transistor formed according to an embodiment, depicted in successive stages of fabrication.

The present disclosure is described with reference to the attached figures, wherein like reference numerals are used throughout the figures to designate similar or equivalent elements. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

An integrated circuit may include a hybrid active-field gap extended drain MOS transistor with multiple parallel alternating active gap drift regions and field gap drift regions. The field plates are extensions of the gate. The field plates terminate on field oxide elements in a drain of the extended drain MOS transistor.

Figure 1B:
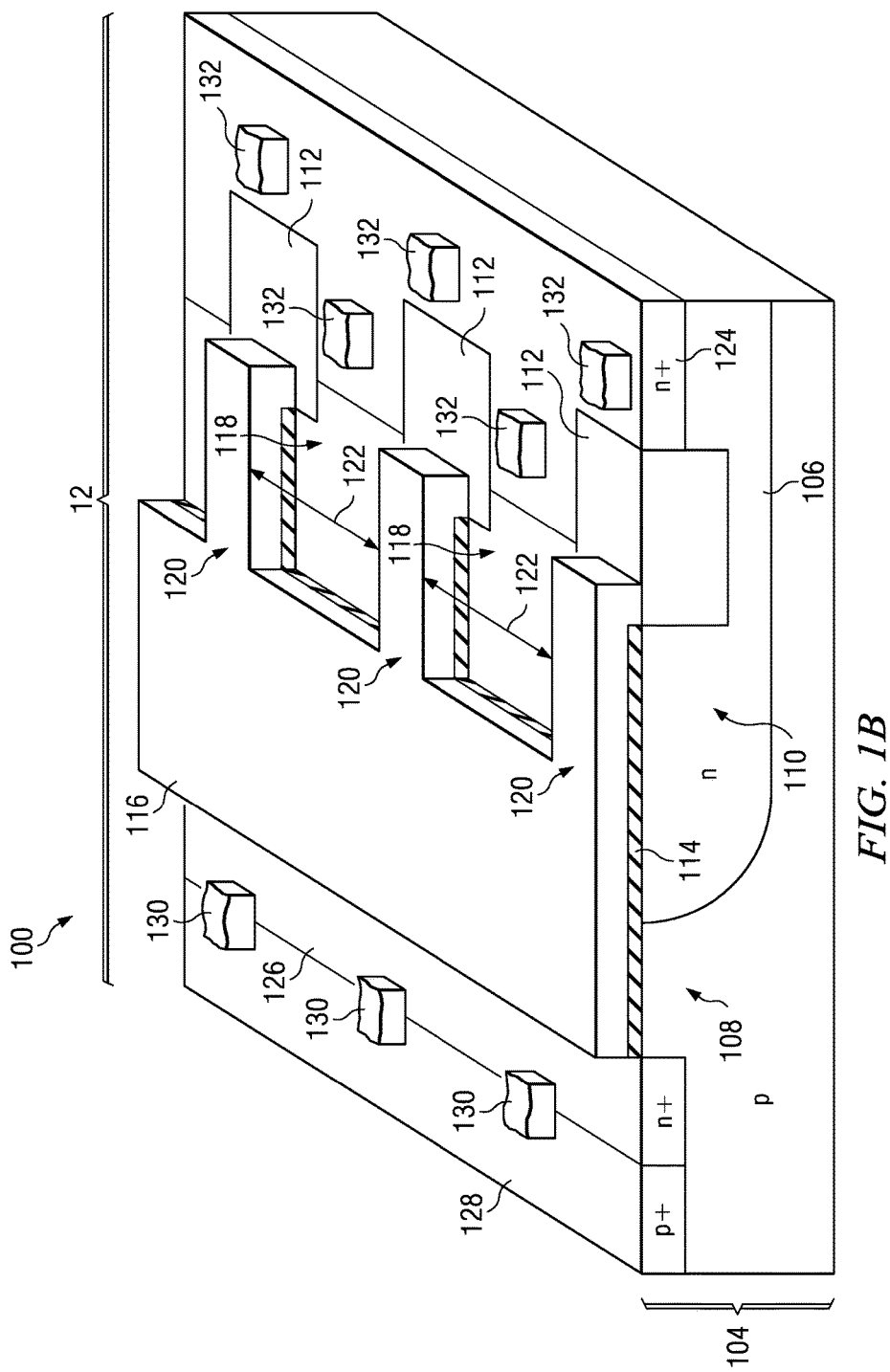

FIG. 1A and FIG. 1B are perspective views of an integrated circuit 100 containing a hybrid active-field gap extended drain MOS transistor 102 formed according to an embodiment, depicted in successive stages of fabrication. The integrated circuit 100 is formed in and on a substrate 104, which may be a single crystal silicon wafer, a silicon-on-insulator (SOI) wafer, a hybrid orientation technology (HOT) wafer with regions of different crystal orientations, or other material appropriate for fabrication of the integrated circuit 100. An extended drain 106 of the extended drain MOS transistor 102 is formed in the substrate 104 abutting a channel region 108 of the extended drain MOS transistor 102. The extended drain 106 includes a drift region 110. The extended drain 106 may be formed, for example, by a process including the steps of: forming an ion implant mask of photoresist over the substrate 104 by a photolithographic process so as to expose an area for the extended drain 106, ion implanting dopants into the substrate 104 in the areas exposed by the ion implant mask, removing the ion implant mask and annealing the substrate 104 so as to activate the implanted dopants. Field oxide elements 112 are formed in the extended drain 106 adjacent to the drift region 110. The field oxide 112 may be, for example, primarily composed of silicon dioxide 250 to 600 nanometers thick. The field oxide elements 112 may be formed by shallow trench isolation (STI) processes as depicted in FIG. 1A, by local oxidation of silicon (LOCOS) processes, or by other methods. An STI process may include the steps of: forming an oxide layer on the substrate 104, forming a silicon nitride layer on the oxide layer, patterning the silicon nitride layer so as to expose an area for the field oxide 112, etching a trench in the substrate 104 in the exposed area to an appropriate depth for a desired thickness of the field oxide 112, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer. A LOCOS process may include the steps of: forming an oxide layer on the substrate 104, forming a silicon nitride layer on the oxide layer, patterning the silicon nitride layer so as to expose an area for the field oxide 112, growing thermal oxide at the top surface of the substrate 104 in the exposed area to an appropriate thickness for a desired thickness of the field oxide 112, and removing the silicon nitride layer.

The extended drain 106 extends below the field oxide elements 112. In an alternate version of the instant embodiment, the field oxide elements 112 may be formed prior to forming the extended drain 106.

Referring to FIG. 1B, a gate dielectric layer 114 is formed on the substrate 104 over the channel region 108 and the drift region 110. The gate dielectric layer 114 may be, for example, one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layer 114 may include nitrogen as a result of exposure to a nitrogen containing plasma or a nitrogen containing ambient gas at temperatures between 50 C and 800 C. A thickness of the gate dielectric layer 114 may be 2.5 to 3.0 nanometers per volt of gate-source bias. The gate dielectric layer 114 may be formed by any of a variety of gate dielectric formation processes, for example thermal oxidation, plasma nitridation of an oxide layer, and/or dielectric material deposition by atomic layer deposition (ALD).

A gate 116 of the extended drain MOS transistor 102 is formed on the gate dielectric layer 114, so as to expose active gap regions 118 of the drift region 110, and so as to form field plates 120 between the active gap regions 118 extending onto the field oxide elements 112. The gate 116 may be formed, for example, by a process including the steps of: forming a layer of gate material such as polycrystalline silicon, commonly referred to as polysilicon, over the gate dielectric layer 114, forming a gate etch mask including photoresist over the gate material layer using a photolithographic process so as to cover an area for the gate 116, performing a gate etch process by a reactive ion etch (ME) process which removes material from the gate material layer in areas exposed by the gate etch mask, and removing the gate etch mask.

Areas of the drift region 110 under the field plates 120 are field gap drift regions. In one version of the instant embodiment, an active gap width 122 of each active gap region 118 between adjacent field plates 120 is less than 2 microns. In a further version, the active gap width 122 of each active gap region 118 is less than 1 micron. Gate sidewall spacers, not shown, may be formed on lateral surfaces of the gate 116.

A drain contact diffused region 124 is formed in the extended drain 106 abutting the active gap regions 118 and the field oxide elements 112. A source 126 of the extended drain MOS transistor 102 is formed in the substrate 104 abutting the channel region 108 and opposite the extended drain 106. The drain contact diffused region 124 and the source 126 may be formed concurrently, for example, by a process including the steps of: forming an ion implant mask of photoresist over an existing top surface of the integrated circuit 100 by a photolithographic process so as to expose an area for the drain contact diffused region 124 and an area for the source 126, ion implanting dopants into the substrate 104 in the areas exposed by the ion implant mask, removing the ion implant mask and annealing the substrate 104 so as to activate the implanted dopants.

A backgate contact diffused region 128 may be formed in the substrate 104 so as to make electrical connection with the channel region 108. The backgate contact diffused region 128, if formed, may be distributed as depicted in FIG. 1B or may be localized. The backgate contact diffused region 128 may be formed, for example, by a process including the steps of: forming an ion implant mask of photoresist over an existing top surface of the integrated circuit 100 by a photolithographic process so as to expose an area for the backgate contact diffused region 128, ion implanting dopants into the substrate 104 in the areas exposed by the ion implant mask, removing the ion implant mask and annealing the substrate 104 so as to activate the implanted dopants.

Source contacts 130 are formed on the source 126 and optionally the backgate contact diffused region 128 if present. Drain contacts 132 are formed on the drain contact diffused region 124. In one version of the instant embodiment, a drain contact 132 is formed adjacent to each active gap region 118 and adjacent to each field oxide element 112 opposite each field plate 120 overlapping the field oxide element 112. The contacts 130 and 132 may be formed, for example, by a process including the steps of: defining contact areas on a top surface of a pre-metal dielectric (PMD) layer over the substrate 104 with a contact photoresist pattern formed by a photolithographic process, etching contact holes in the contact areas by removing PMD layer material using an RIE process to expose the substrate 104, and filling the contact holes with a contact liner metal, such as titanium, and a contact fill metal, typically tungsten, followed by removal of the contact fill metal from the top surface of the PMD layer using etching and/or CMP methods.

During operation of the extended drain MOS transistor 102, the active gap regions 118 may provide a desired impedance through the drift region 110 while the field plates 120 may reduce an electric field in the active gap regions 118 so as to provide a desired high breakdown voltage and desired level of hot carrier reliability.

In one version of the instant embodiment, the extended drain MOS transistor 102 may be n-channel, as shown in FIG. 1A and FIG. 1B. In another version, the extended drain MOS transistor 102 may be p-channel.

Figure 2:
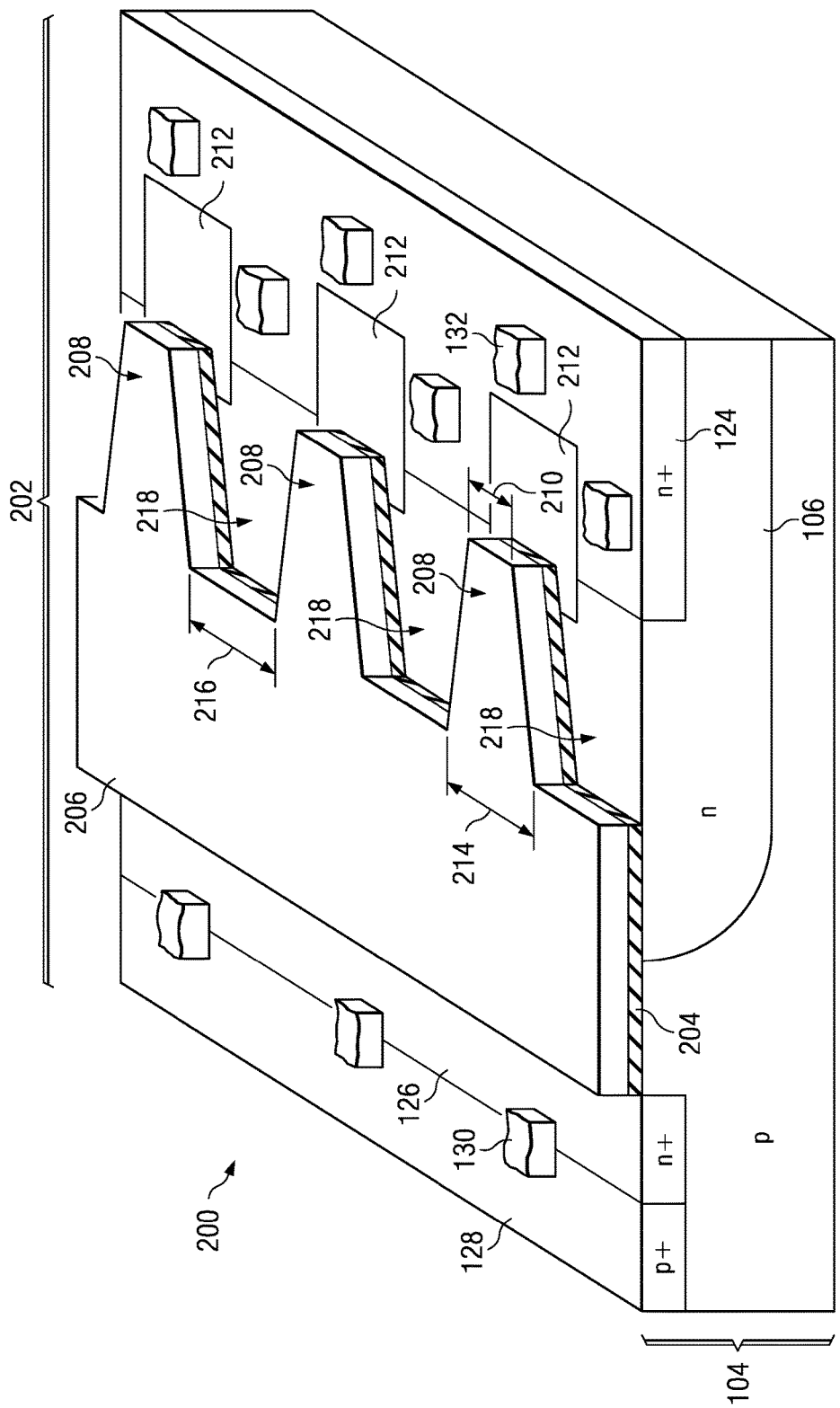
FIG. 2 is a perspective view of an integrated circuit containing a hybrid active-field gap extended drain MOS transistor formed according to another embodiment.

FIG. 2 is a perspective view of an integrated circuit 200 containing a hybrid active-field gap extended drain MOS transistor 202 formed according to another embodiment. A gate 206 of the extended drain MOS transistor 202 is formed on a gate dielectric layer 204 so as to have tapered field plates 208. A drain end width 210 of each tapered field plate 208 over field oxide elements 212 is at least 100 nanometers less than a source end width 214 of each tapered field plate 208 on an opposite side of the tapered field plate 208 from the corresponding field oxide element 212. In one version of the instant embodiment, a source end active gap width 216 of each active gap region 218 is less than 2 microns. In a further version, the source end active gap width 216 of each active gap region 218 is less than 1 micron. The drain end width 210 and the source end width 214 of each tapered field plate 208 are such that each point at a top surface of an active gap region is within a micron of an adjacent field plate in the field gap drift regions. Dimensions of the tapered field plates 208 and active gap regions 218 may be adjusted to provide desired values of breakdown voltage, on-state current and hot carrier reliability.

In one version of the instant embodiment, the extended drain MOS transistor 202 may be n-channel, as shown in FIG. 2. In another version, the extended drain MOS transistor 202 may be p-channel.

Figure 3:
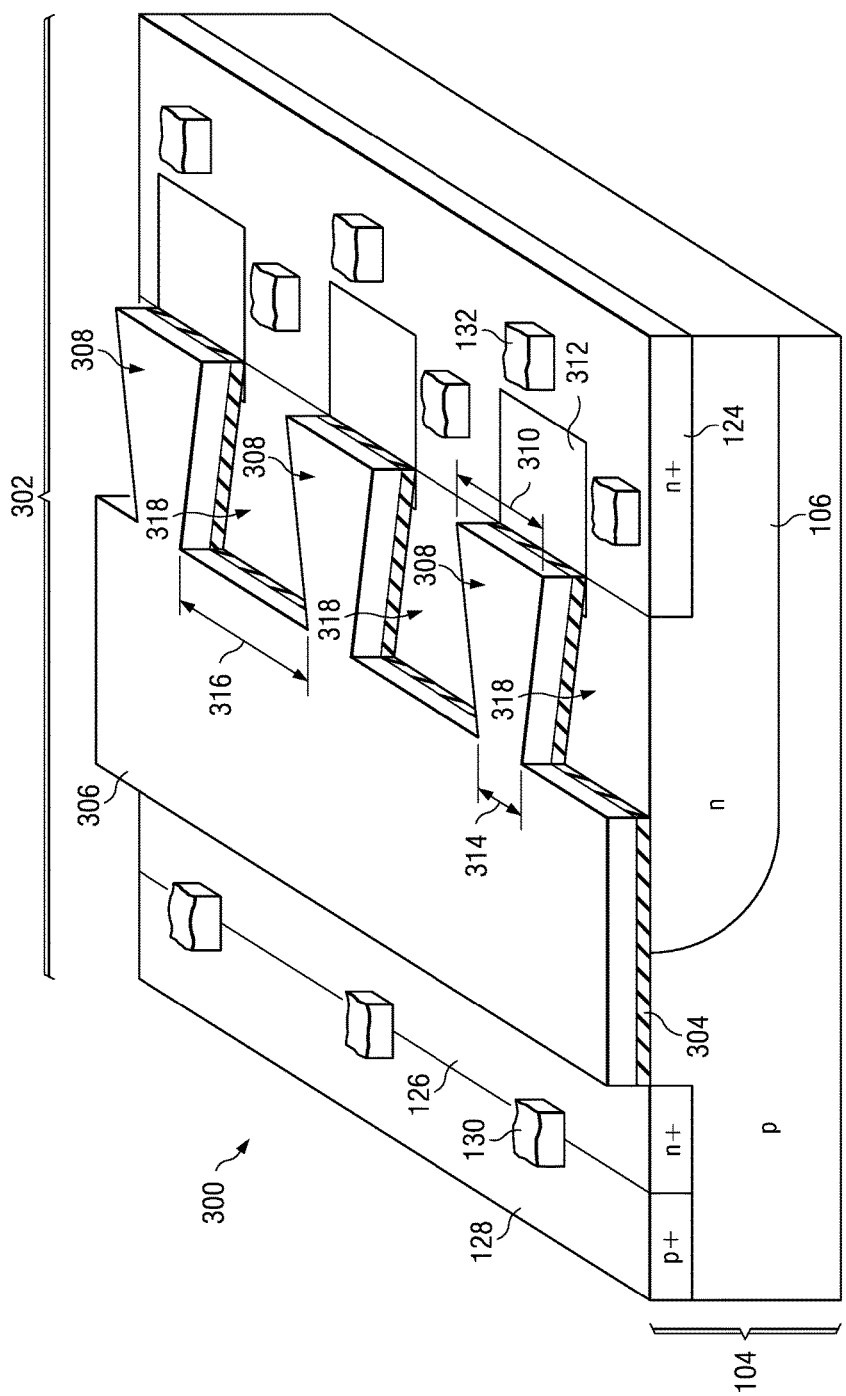
FIG. 3 is a perspective view of an integrated circuit containing a hybrid active-field gap extended drain MOS transistor formed according to a further embodiment.

FIG. 3 is a perspective view of an integrated circuit 300 containing a hybrid active-field gap extended drain MOS transistor 302 formed according to a further embodiment. A gate 306 of the extended drain MOS transistor 302 is formed over a gate dielectric layer 304 so as to have retrograde tapered field plates 308. A drain end width 310 of each retrograde tapered field plate 308 over field oxide elements 312 is at least 100 nanometers more than a source end width 314 of each retrograde tapered field plate 308 on an opposite side of the retrograde tapered field plate 308 from the corresponding field oxide element 312. In one version of the instant embodiment, a source end active gap width 316 of each active gap region 318 is less than 2 microns. In a further version, the source end active gap width 316 of each active gap region 318 is less than 1 micron. Dimensions of the retrograde tapered field plates 308 and active gap regions 318 may be adjusted to provide desired values of breakdown voltage, on-state current and hot carrier reliability.

In one version of the instant embodiment, the extended drain MOS transistor 302 may be n-channel, as shown in FIG. 3. In another version, the extended drain MOS transistor 302 may be p-channel.

Figure 4A:
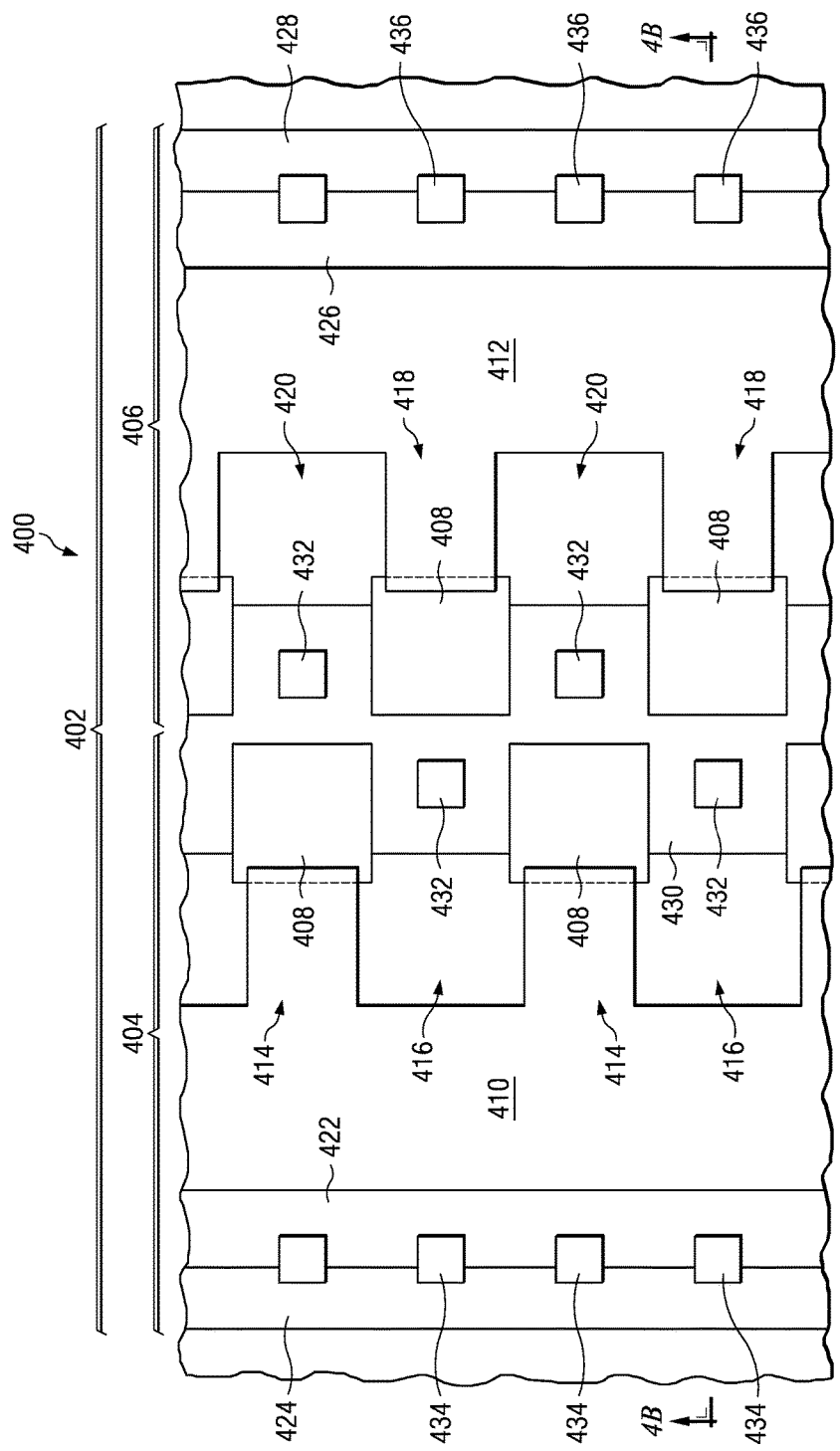
FIG. 4A and FIG. 4B are a top view and a cross section, respectively, of an integrated circuit containing a hybrid active-field gap extended drain MOS transistor formed in a symmetric nested configuration according to an embodiment.
Figure 4B:
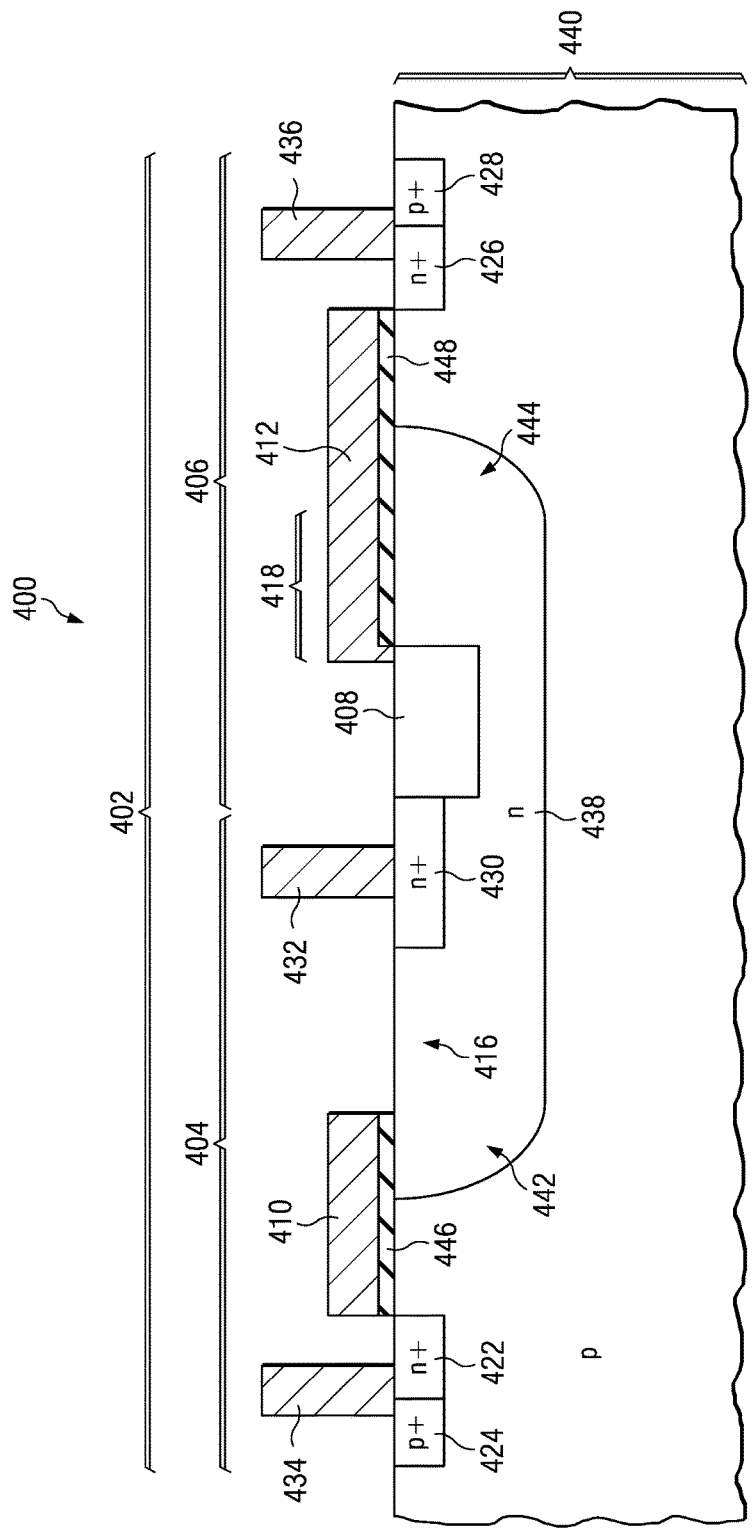

FIG. 4A and FIG. 4B are a top view and a cross section, respectively, of an integrated circuit 400 containing a hybrid active-field gap extended drain MOS transistor 402 formed in a symmetric nested configuration according to an embodiment. Referring to FIG. 4A, the extended drain MOS transistor 402 includes a first portion 404 and a second portion 406. Field oxide elements 408 are formed in an extended drain, not shown, of the extended drain MOS transistor 402 in the first portion 404 and the second portion 406 in an alternating linear configuration as depicted in FIG. 4. The extended drain extends under the field oxide elements 408 and laterally past the field oxide elements 408 and includes a first drift region, not shown, in the first portion 404 and a second drift region, not shown, in the second portion 406. The extended drain MOS transistor 402 includes a first channel region, not shown, in the first portion 404 abutting the first drift region, and includes a second channel region, not shown, in the second portion 406 abutting the second drift region, so that the second channel region is located on an opposite side of the extended drain from the first channel region. A first gate section 410 and a second gate section 412 are formed on a gate dielectric layer, not shown, over the first drift region and first channel region, and over the second drift region and second channel region, respectively. The first gate section 410 and the second gate section 412 may optionally be joined at one or both ends of the extended drain MOS transistor 402. The first gate section 410 includes first field plates 414 extending onto the field oxide elements 408. The first field plates 414 cover first field gap drift regions, not shown, alternating with first active gap regions 416, in the first portion 404. The second gate section 412 includes second field plates 418 extending onto the field oxide elements 408. The second field plates 418 cover second field gap drift regions, not shown, alternating with second active gap regions 420, in the second portion 406. The first field plates 414 are aligned with the second active gap regions 420, and the second field plates 418 are aligned with the first active gap regions 416. In one version of the instant embodiment, an active gap width of each first active gap region 416 between adjacent first field plates 414 and of each second active gap region 420 between adjacent second field plates 418 is less than 2 microns. In a further version, the active gap width of each first active gap region 416 and each second active gap region 420 is less than 1 micron.

A first source 422 is formed in the first portion 404 abutting the first channel region and adjacent to the first gate section 410. A first backgate contact diffused region 424 may be formed adjacent to the first source 422 so as to make electrical connection with the first channel region. A second source 426 is formed in the second portion 406 abutting the second channel region and adjacent to the second gate section 412. A second backgate contact diffused region 428 may be formed adjacent to the second source 426 so as to make electrical connection with the second channel region. A drain contact diffused region 430 is formed in the extended drain abutting the first active gap regions 416 and the second active gap regions 420 and abutting the field oxide elements 408.

Drain contacts 432 are formed on the drain contact diffused region 430 adjacent to the first active gap regions 416 and the second active gap regions 420, so that each drain contact 432 provides drain current to the corresponding adjacent active gap region 416 or 420 and the corresponding field gap drift region opposite the active gap region. In one version of the instant embodiment, a drain contact 432 is formed adjacent to each first active gap region 416 and each second active gap region 420. First source contacts 434 are formed on the first source 422, and optionally on the first backgate contact diffused region 424 if present. Second source contacts 436 are formed on the second source 426, and optionally on the second backgate contact diffused region 428 if present. Dimensions and locations of the field oxide elements 408, the first active gap regions 416 and the second active gap regions 420, the first field gap drift regions and the second field gap drift regions, and the drain contact diffused region 430 may be adjusted to reduce a total area of the extended drain MOS transistor 402 while providing a desired on-state current, a desired breakdown voltage and a desired hot carrier reliability.

Referring to FIG. 4B, the extended drain 438 is formed in a substrate 440 and includes a first drift region 442 in the first portion 404 and a second drift region 444 in the second portion 406. The first gate section 410 is formed on a first gate dielectric layer 446 and the second gate section 412 is formed on a second gate dielectric layer 448.

In one version of the instant embodiment, the extended drain MOS transistor 402 may be n-channel, as shown in FIG. 4B. In another version, the extended drain MOS transistor 402 may be p-channel.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An integrated circuit, comprising:
a semiconductor substrate; and
an extended drain metal-oxide semiconductor (EDMOS) transistor, including:
   a channel region positioned in the semiconductor substrate;
   an extended drain positioned in the semiconductor substrate, the extended drain including a drift region having field gap drift regions and active gap regions alternating with the field gap drift regions, the drift region abutting the channel region;
   field oxide structures positioned adjacent to the field gap drift regions and opposing the channel region; and
   a drain contact diffused region positioned on the extended drain, the drain contact diffused region having a higher doping concentration than the extended drain, and abutting the active gap regions and interleaving with the field oxide structures;
a first drain contact positioned on the drain contact diffused region, the first drain contact spaced apart from the field gap drift regions by the field oxide structures; and
a second drain contact positioned on the drain contact diffused region, the second drain contact interposed between two of the field oxide structures, and the second drain contact positioned closer to the channel region than the first drain contact.

2. The integrated circuit of claim 1, wherein the extended drain extends below the field oxide structures.

3. The integrated circuit of claim 1, further comprising:
a gate dielectric layer positioned over the channel region and the drift region; and
a gate positioned on the gate dielectric layer over the channel region.

4. The integrated circuit of claim 3, wherein the gate includes a field plate extending beyond the gate dielectric layer and onto the field oxide structures.

5. The integrated circuit of claim 1, further comprising:
a drain contact positioned on the drain contact diffused region, the drain contact spaced apart from the field gap drift regions by the field oxide structures.

6. The integrated circuit of claim 1, further comprising:
a drain contact positioned on the drain contact diffused region, the drain contact interposed between two of the field oxide structures.

7. The integrated circuit of claim 1, wherein at least one of the field oxide structures abuts at least one of the field gap drift regions, at least one of the active gap regions, and the drain contact diffused region.

8. The integrated circuit of claim 1, wherein at least one of the field oxide structures separates at least one of the field gap drift regions from the drain contact diffused region.

9. The integrated circuit of claim 1, wherein at least one of the field oxide structures interfaces a junction between at least one of the active gap regions and the drain contact diffused region.

10. An extended drain metal-oxide semiconductor (EDMOS) transistor, comprising:
an extended drain including field gap regions located under field plates of a gate electrode, and active gap regions located between the field gap regions;
field oxide elements, each field oxide element located under a corresponding one of the field plates; and
a drain contact region positioned above the extended drain, the drain contact region including a plurality of drain contacts, each of a first subset of the drain contacts being adjacent a corresponding one of the active gap regions, and each of a second subset of the drain contacts being adjacent a corresponding one of the field oxide elements, the drain contact region having:
   first portions, each first portion located between one of the active gap regions and a corresponding one of the drain contacts in the first subset of drain contacts; and
   second portions, each second portion located between one of the field oxide elements and a corresponding one of the drain contacts in the second subset of drain contacts.

11. The EDMOS transistor of claim 10, further comprising:
a dielectric structure positioned within the extended drain, the dielectric structure separating at least one of the second portions of the drain contact region from at least one of the field gap regions, and the dielectric structure crossing a junction between at least one of the active gap regions and at least one of the first portions of the drain contact region.

12. The EDMOS transistor of claim 10, further comprising:
a source region opposing the extended drain;
a channel region interposed between the source region and the extended drain;
a gate dielectric layer positioned over the channel region and the extended drain; and
a gate positioned on the gate dielectric layer over the channel region.

13. The EDMOS transistor of claim 12, wherein the gate includes a field plate shielding the gate dielectric layer from the drain contact region.

14. The EDMOS transistor of claim 12, wherein:
the gate dielectric layer is free of overlapping the active gap regions; and
the gate is free of overlapping the active gap regions.

15. The EDMOS transistor of claim 10, wherein each of said field oxide elements is located between adjacent pairs of said first portions.

16. An integrated circuit, comprising:
extended drain metal-oxide semiconductor (EDMOS) transistors, each comprising:
an extended drain including field gap regions located under field plates of a gate electrode, and active gap regions located between the field gap regions;
field oxide elements, each field oxide element located under a respective one of said field plates; and
a drain contact region positioned above the extended drain, the drain contact region including a plurality of drain contacts, each of a first subset of the drain contacts being adjacent a corresponding one of the active gap regions, and each of a second subset of the drain contacts being adjacent a corresponding one of the field oxide elements, the drain contact region having:
   first portions, each first portion located between one of the active gap regions and a corresponding one of the drain contacts in the first subset of drain contacts; and
   second portions, each second portion located between one of the field oxide elements and a corresponding one of the drain contacts in the second subset of drain contacts.

17. The integrated circuit of claim 16, wherein each of the EDMOS transistors includes:
a dielectric structure positioned within the extended drain, the dielectric structure separating at least one of the second portions of the drain contact region from at least one of the field gap regions, and the dielectric structure interfacing a junction between at least one of the active gap regions and at least one of the first portions of the drain contact region.

18. The integrated circuit of claim 16, wherein each of the EDMOS transistors includes:
a source region opposing the extended drain;
a channel region interposed between the source region and the extended drain;
a gate dielectric layer positioned over the channel region and the extended drain; and
a gate positioned on the gate dielectric layer over the channel region.

19. The integrated circuit of claim 18, wherein the gate includes a field plate shielding the gate dielectric layer from the drain contact region.

20. The integrated circuit of claim 18, wherein:
the gate dielectric layer is free of overlapping the active gap regions; and
the gate is free of overlapping the active gap regions.

* * * * *